United States Patent
Zhang et al.

(10) Patent No.: US 10,584,409 B2
(45) Date of Patent: *Mar. 10, 2020

(54) COATED ARTICLE HAVING LOW-E COATING WITH IR REFLECTING LAYER(S) AND DOPED TITANIUM OXIDE DIELECTRIC LAYER(S) AND METHOD OF MAKING SAME

(71) Applicant: Guardian Glass, LLC, Auburn Hills, MI (US)

(72) Inventors: Guizhen Zhang, Auburn Hills, MI (US); Daniel Schweigert, Auburn Hills, MI (US); Guowen Ding, Auburn Hills, MI (US); Daniel Lee, Auburn Hills, MI (US); Cesar Clavero, Auburn Hills, MI (US); Scott Jewhurst, Auburn Hills, MI (US); Gaurav Saraf, Auburn Hills, MI (US); Minh Le, Auburn Hills, MI (US); Nestor P. Murphy, West Bloomfield, MI (US); Marcus Frank, Gelhausen (DE)

(73) Assignee: GUARDIAN GLASS, LLC., Auburn Hills, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/266,313

(22) Filed: Feb. 4, 2019

(65) Prior Publication Data

US 2019/0226077 A1    Jul. 25, 2019

Related U.S. Application Data

(63) Continuation of application No. 15/448,739, filed on Mar. 3, 2017, now Pat. No. 10,196,735.

(51) Int. Cl.
*C23C 14/18* (2006.01)
*C03C 17/36* (2006.01)
*C03C 17/34* (2006.01)

(52) U.S. Cl.
CPC .............. *C23C 14/18* (2013.01); *C03C 17/34* (2013.01); *C03C 17/36* (2013.01); *C03C 17/366* (2013.01);
(Continued)

(58) Field of Classification Search
USPC ........ 428/426, 428, 432, 434, 688, 701, 702
See application file for complete search history.

(56) References Cited

U.S. PATENT DOCUMENTS

| 4,883,721 A | 11/1989 | Nalepka et al. |
| 5,110,637 A * | 5/1992 | Ando ...................... C03C 17/23 |
| | | 428/34 |

(Continued)

FOREIGN PATENT DOCUMENTS

| EP | 2 746 236 | 6/2014 |
| WO | WO 03/055816 | 7/2003 |

(Continued)

OTHER PUBLICATIONS

U.S. Appl. No. 15/448,739, filed Mar. 3, 2017; Zhang et al.
U.S. Appl. No. 15/448,620, filed Mar. 3, 2017; Saraf et al.
U.S. Appl. No. 15/448,629, filed Mar. 3, 2017; Ding et al.

*Primary Examiner* — Lauren R Colgan

(57) ABSTRACT

A coated article includes a low emissivity (low-E) coating having at least one infrared (IR) reflecting layer of a material such as silver, gold, or the like, and at least one high refractive index layer of or including titanium oxide and at least one additional metal. A doped titanium oxide layer(s) is designed and deposited in a manner so as to be amorphous or substantially amorphous (as opposed to crystalline) in the low-E coating, so as to better withstand optional heat (Continued)

treatment (HT) such as thermal tempering and reduce haze. The high index layer may be a transparent dielectric high index layer in preferred embodiments, which may be provided for antireflection purposes and/or color adjustment purposes, in addition to having thermal stability.

5 Claims, 10 Drawing Sheets

(52) U.S. Cl.
CPC ...... *C03C 17/3618* (2013.01); *C03C 17/3644* (2013.01); *C03C 17/3681* (2013.01); *C23C 14/185* (2013.01)

(56) References Cited

U.S. PATENT DOCUMENTS

| | | | |
|---|---|---|---|
| 5,344,718 | A | 9/1994 | Hartig et al. |
| 6,210,784 | B1 | 4/2001 | Rondeau et al. |
| 6,355,334 | B1 | 3/2002 | Rondeau et al. |
| 6,576,349 | B2 | 6/2003 | Lingle et al. |
| 6,589,658 | B1 | 7/2003 | Stachowiak |
| 6,602,608 | B2 | 8/2003 | Stachowiak |
| 6,610,410 | B2 | 8/2003 | Ebisawa et al. |
| 6,830,817 | B2 | 12/2004 | Stachowiak |
| 7,005,188 | B2 | 2/2006 | Anderson et al. |
| 7,153,579 | B2 | 12/2006 | Kriltz et al. |
| 7,241,506 | B2 | 7/2007 | Hartig |
| 7,390,572 | B2 | 6/2008 | Butz et al. |
| 7,901,781 | B2 * | 3/2011 | Maschwitz ....... B32B 17/10036 428/212 |
| 8,105,695 | B2 | 1/2012 | Depauw |
| 8,945,714 | B2 | 2/2015 | Lao et al. |
| 9,028,956 | B2 | 5/2015 | Knoll et al. |
| 9,028,983 | B2 | 5/2015 | Imran et al. |
| 9,045,363 | B2 | 6/2015 | Hassan |
| 9,052,456 | B2 | 6/2015 | Hassan et al. |
| 9,199,874 | B2 | 12/2015 | Peter et al. |
| 9,212,417 | B2 | 12/2015 | Frank et al. |
| 9,297,197 | B2 | 3/2016 | Lao et al. |
| 9,315,414 | B2 | 4/2016 | Hassan et al. |
| 9,365,450 | B2 | 6/2016 | Ding et al. |
| 9,371,684 | B2 | 6/2016 | Butz et al. |
| 9,403,345 | B2 | 8/2016 | Lao et al. |
| 9,410,359 | B2 | 8/2016 | Ding et al. |
| 9,494,717 | B2 | 11/2016 | Reymond et al. |
| 9,499,437 | B2 | 11/2016 | Imran et al. |
| 9,518,319 | B2 | 12/2016 | Ding et al. |
| 9,556,070 | B2 | 1/2017 | Wuillaume et al. |
| 10,196,735 | B2 | 2/2019 | Zhang et al. |
| 2009/0004412 | A1 | 1/2009 | Decroupet et al. |
| 2009/0011194 | A1 | 1/2009 | Nadaud et al. |
| 2010/0167034 | A1* | 7/2010 | Depauw .................. C03C 17/36 428/216 |
| 2014/0170421 | A1 | 6/2014 | Ding et al. |
| 2014/0186598 | A1 | 7/2014 | Ding |
| 2014/0308528 | A1 | 10/2014 | Ding |
| 2015/0177583 | A1 | 6/2015 | Ding |
| 2015/0177585 | A1 | 6/2015 | Ding |

FOREIGN PATENT DOCUMENTS

| | | |
|---|---|---|
| WO | WO 2012/127162 | 9/2012 |
| WO | WO 2017/006030 | 1/2017 |

\* cited by examiner

| Material | Cation | Oxidation | Ionic Radii (pm) | | $\Delta G_f$ (KJ/mol) @298K |
|---|---|---|---|---|---|
| | | | 4 Co-ordinated | 6 Co-ordinated | |
| TiOx | Ti | 2+ | | 86 | -985.1 |
| | | 3+ | | 67 | -950.0 |
| | | 4+ | 42 | 61 | -888.0 |
| SnOx | Sn | 2+ | | 118 | -520.0 |
| | | 4+ | 55 | 69 | -545.4 |
| ZrOx | Zr | 4+ | 59 | 72 | -1037.3 |
| | | 4+ | | 66 | -529.9 |
| WOx | W | 5+ | | 62 | |
| | | 6+ | 42 | 60 | -506.8 |

COATED ARTICLE HAVING LOW-E COATING WITH IR REFLECTING LAYER(S) AND DOPED TITANIUM OXIDE DIELECTRIC LAYER(S) AND METHOD OF MAKING SAME

This application is a continuation of application Ser. No. 15/448,739, filed Mar. 3, 2017 (now U.S. Pat. No. 10,196,735), the entire disclosure of which is hereby incorporated herein by reference.

This application relates to a coated article including a low emissivity (low-E) coating having at least one infrared (IR) reflecting layer of a material such as silver, gold, or the like, and at least one high refractive index layer of or including doped titanium oxide (e.g., $TiO_2$ doped with at least one additional element). The doped titanium oxide layer(s) is designed and deposited in a manner so as to be amorphous or substantially amorphous (as opposed to crystalline) in the low-E coating, so as to better withstand optional heat treatment (HT) such as thermal tempering. The high index layer may be a transparent dielectric high index layer in preferred embodiments, which may be provided for antireflection purposes and/or color adjustment purposes, in addition to having thermal stability. In certain example embodiments, the low-E coating may be used in applications such as monolithic or insulating glass (IG) window unit, vehicle windows, of the like.

BACKGROUND AND SUMMARY OF EXAMPLE EMBODIMENTS OF THE INVENTION

Coated articles are known in the art for use in window applications such as insulating glass (IG) window units, vehicle windows, monolithic windows, and/or the like.

Conventional low-E coatings are disclosed, for example and without limitation, in U.S. Pat. Nos. 6,576,349, 9,212,417, 9,297,197, 7,390,572, 7,153,579, and 9,403,345, the disclosures of which are hereby incorporated herein by reference.

Certain low-E coating utilize at least one transparent dielectric layer of titanium oxide (e.g., $TiO_2$), which has a high refractive index (n), for antireflection and/or coloration purposes. See for example U.S. Pat. Nos. 9,212,417, 9,297,197, 7,390,572, 7,153,579, and 9,403,345. Although high refractive index dielectric materials such as $TiO_2$ are known and used in low-E coatings, these materials are not thermally stable and are typically not heat stable after tempering process of about 650 C for 8 minutes, due to film crystallization (or change in crystallinity) in as-deposited or post-tempering state, which may in turn induce thermal or lattice stress on adjacent layers in the film stack. Such stress can further cause change in physical or material properties of the stack and hence impact on the Ag layer, which results in deteriorated low E stack performance. In other words, conventional $TiO_2$ layers are typically sputter-deposited so as to realize a crystalline structure, which leads to damage to the stack upon HT as explained above.

Example embodiments of this invention solve these problems by providing a high index doped titanium oxide layer for use in low-E coatings that both has a high refractive index (n) and is substantially stable upon heat treatment (HT).

"Heat treatment" (HT) and like terms such as "heat treating" and "heat treated", such as thermal tempering, heat strengthening, and/or heat bending, as used herein means heat treating the glass substrate and coating thereon at temperature of at least 580 degrees C. for at least 5 minutes. An example heat treatment is heat treating at temperature of about 600-650 degrees C. for at least 8 minutes.

In example embodiments of this invention, a coated article includes a low emissivity (low-E) coating having at least one infrared (IR) reflecting layer of a material such as silver, gold, or the like, and at least one high refractive index dielectric layer of or including doped titanium oxide (e.g., $TiO_2$ doped with at least one additional element such as Sn, ZnSn, Y, Zr, and/or Ba). The doped titanium oxide layer(s) is designed and deposited in a manner so as to be amorphous or substantially amorphous (as opposed to crystalline) in the low-E coating, so as to better withstand optional heat treatment (HT) such as thermal tempering. For example, it has been found that sputter-depositing the doped titanium oxide layer(s) in an oxygen depleted atmosphere results in the doped titanium oxide layer being deposited in an amorphous or substantially amorphous (as opposed to crystalline) state, which in turn allows the layer and overall coating to be much more stable upon HT. The high index layer(s) may be a transparent dielectric high index layer in preferred embodiments, which may be provided for antireflection purposes, transmission, and/or color adjustment purposes, in addition to having thermal stability. In certain example embodiments, the low-E coating may be used in applications such as monolithic or insulating glass (IG) window units, vehicle windows, or the like.

In an example embodiment of this invention, there is provided a coated article including a coating supported by a glass substrate, the coating comprising: a first transparent dielectric layer on the glass substrate; an infrared (IR) reflecting layer comprising silver on the glass substrate, located over at least the first transparent dielectric layer; a second transparent dielectric layer on the glass substrate, located over at least the IR reflecting layer; and wherein at least one of the first and second transparent dielectric layers is amorphous or substantially amorphous, and comprises an oxide of Ti doped with at least one of Sn, SnZn, Zr, Y, and Ba, and wherein metal content of the amorphous or substantially amorphous layer comprises from about 70-99.5% Ti and from about 0.5-30% of at least one of Sn, SnZn, Zr, Y, and Ba (atomic %).

In another example embodiment of this invention, there is provided a coated article including a coating supported by a glass substrate, the coating comprising: a first transparent dielectric layer on the glass substrate; an infrared (IR) reflecting layer comprising silver on the glass substrate, located over at least the first transparent dielectric layer; a second transparent dielectric layer on the glass substrate, located over at least the IR reflecting layer; and wherein at least one of the first and second transparent dielectric layers is amorphous or substantially amorphous, and comprises an oxide of Ti and Ba, and wherein metal content of the amorphous or substantially amorphous layer comprises from about 30-70% Ti and from about 30-70% Ba (atomic %).

In another example embodiment of this invention, there is provided a method of making a coated article including a coating supported by a glass substrate, the method comprising: sputter depositing a first transparent dielectric layer on the glass substrate; sputter-depositing an infrared (IR) reflecting layer comprising silver on the glass substrate, located over at least the first transparent dielectric layer; sputter-depositing a second transparent dielectric layer on the glass substrate, located over at least the IR reflecting layer; and wherein at least one of the first and second transparent dielectric layers is sputter-deposited so as to be amorphous or substantially amorphous, and comprise an oxide of Ti and at least one of Sn, SnZn, Zr, Y, and Ba. The at least one of the first and second transparent dielectric layers sputter-deposited, so as to be amorphous or substantially amorphous, may be sputter-deposited in an oxygen depleted atmosphere so that a difference in radii for metals during sputtering causes lattice disorder leading to amorphous or substantially amorphous structure of the layer.

BRIEF DESCRIPTION OF THE DRAWINGS

FIG. 7 is a chart setting forth oxidation states and ionic radii of various elements.

DETAILED DESCRIPTION OF EXAMPLE EMBODIMENTS OF THE INVENTION

Figure 1:
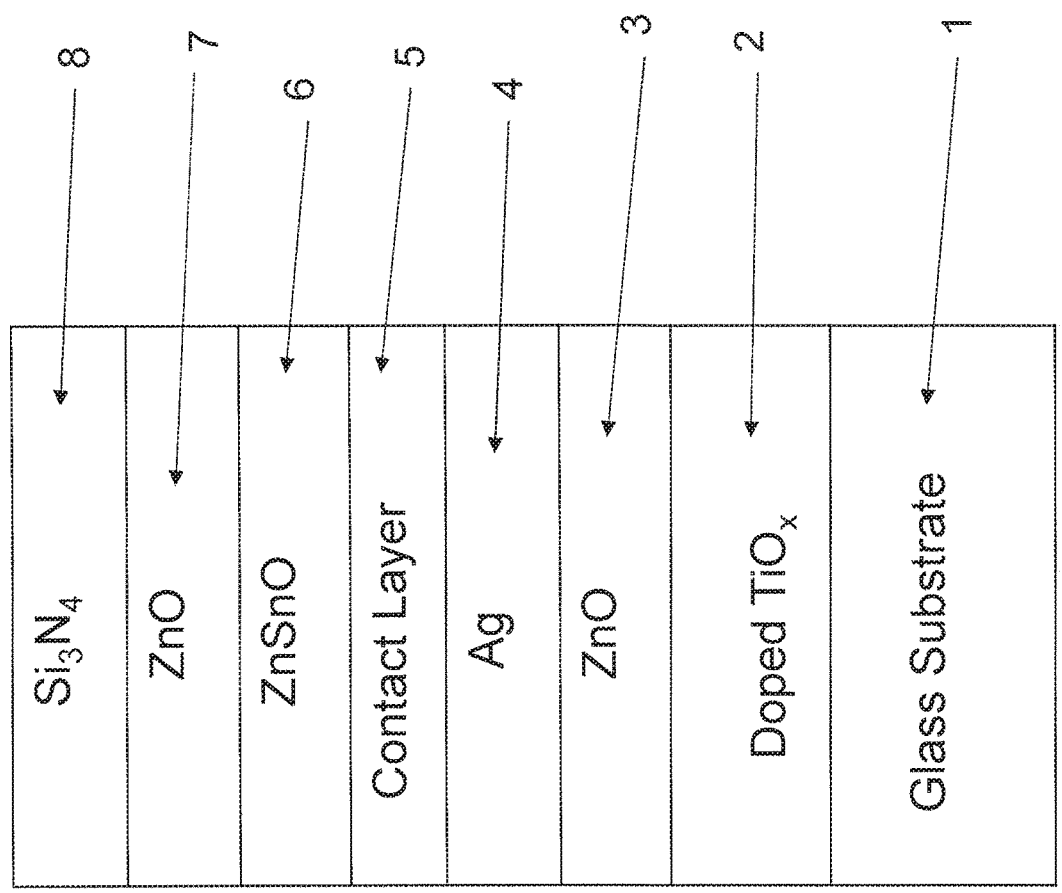
FIG. 1 is a cross sectional view of a coated article according to an example embodiment of this invention.

Referring now to the drawings in which like reference numerals indicate like parts throughout the several views.

Coated articles herein may be used in applications such as monolithic windows, IG window units such as residential windows, patio doors, vehicle windows, and/or any other suitable application that includes single or multiple substrates such as glass substrates.

High refractive index material such as $TiO_2$ with low or no light absorption in the visible range is often used in low-E coatings in window applications. However, $TiO_2$ is typically not heat stable after a thermal tempering process such as involving HT at about 650 C for 8 minutes, due to film crystallization (or change in crystallinity) in as-deposited or post-tempering state, which may in turn induce thermal or lattice stress on adjacent layers in the film stack. Such a stress can further cause change in physical or material properties of the stack and hence impact on the IR reflecting Ag based layer, which results in deteriorated low E stack performance.

Figure 2:
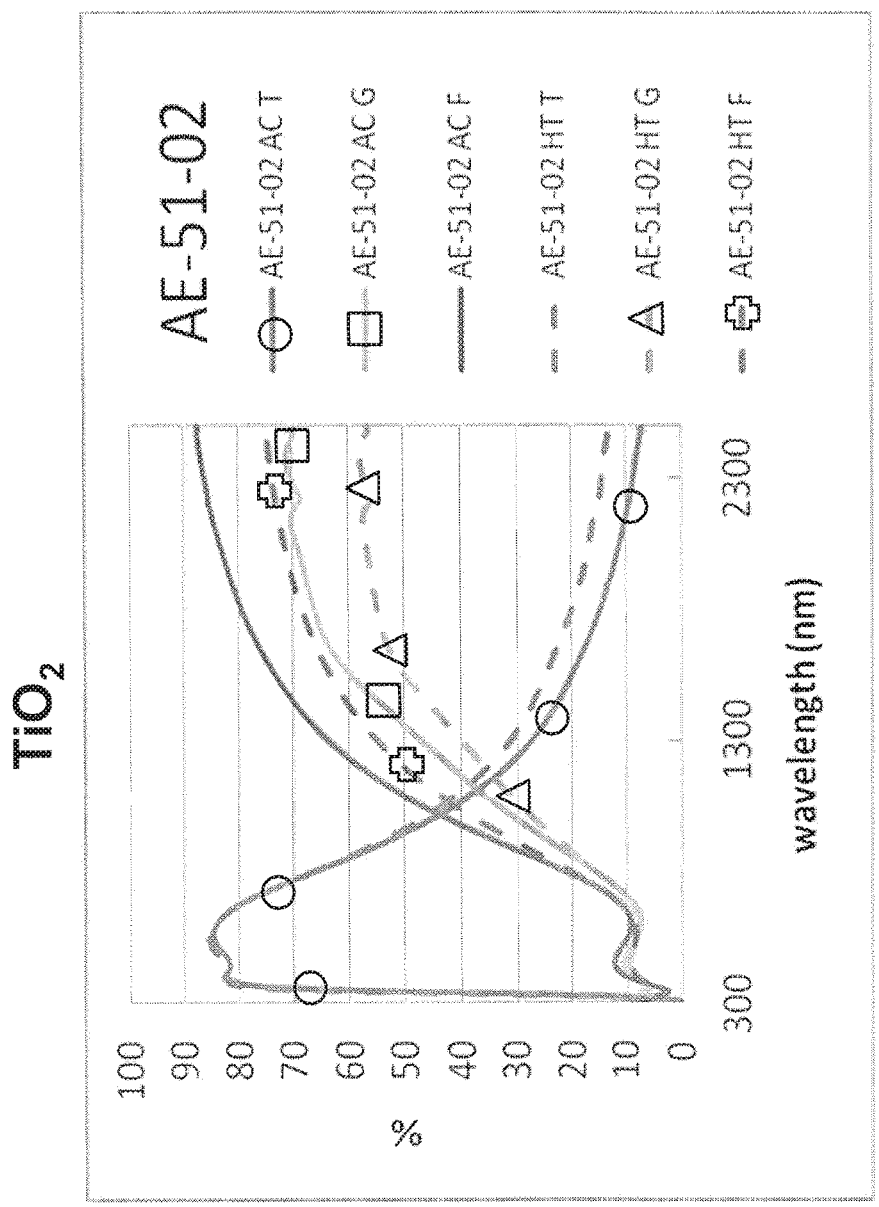
FIG. 2 is a percentage (%) versus wavelength (nm) graph plotting transmission (T) %, glass side reflection (G) %, and film side reflection (F) % of a layer stack including a high index titanium oxide layer versus wavelength (nm) in both as-coated (AC) and post-HT (HT) states.

FIG. 2 illustrates that $TiO_2$ is not thermally stable, and thus is not heat treatable from a practical point of view. FIG. 2 is a percentage (%) versus wavelength (nm) graph plotting transmission (T) %, glass side reflection (G) %, and film side reflection (F) % of a layer stack including a high index titanium oxide layer versus wavelength (nm) in both as-coated (AC) and post-HT states. The layer stack was glass/$TiO_2$ (27 nm)/ZnO (4 nm)/Ag (11 nm)/NiTiNbO$_x$(2.4 nm)/ZnSnO (10 nm)/ZnO (4 nm)/SiN (10 nm), where the ZnO layers were doped with Al in this Comparative Example (CE) stack. Thus, the AC curves are prior to HT, and the HT curves are after heat treatment at about 650 degrees C. for about eight minutes. In FIG. 2, at the right side where the curves are listed, the top three are as coated (AC) which means prior to the HT, and the bottom three are following the heat treatment and thus are labeled "HT." FIG. 2 shows that the layer stack with the crystalline $TiO_2$ is not thermally stable and thus not practically heat treable. In particular, the Comparative Example (CE) of FIG. 2 shows a significant shift in the IR range of the transmission and reflectance spectra, and increases in emissivity and haze were also found. In FIG. 2, in the wavelength area from about 1500 to 2400 nm, there was a shift due to HT from the "AC T" (transmission, as coated prior to HT) curve to the "HT T" (transmission, after HT) curve of about 6%; there was a shift due to HT from the "AC G" (glass side reflectance, as coated prior to HT) curve to the "HT G" (glass side reflectance, after HT) curve of about 12-14%; and there was a shift due to HT from the "AC F" (film side reflectance, as coated prior to HT) curve to the "HT F" (film side reflectance, after HT) curve of about 12-13%. Overall, taken together in combination, there is a significant shift in transmission and reflection spectra upon HT which indicates a lack of thermal stability.

Figure 5:
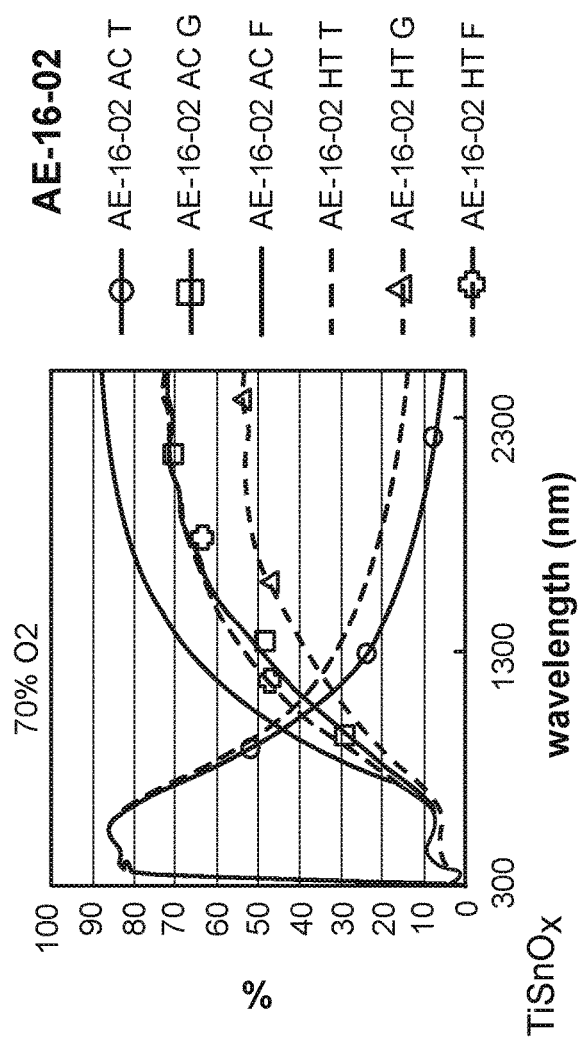
FIG. 5 is a percentage (%) versus wavelength (nm) graph plotting transmission (T) %, glass side reflection (G) %, and film side reflection (F) % of a layer stack including a high index Sn-doped titanium oxide layer versus wavelength (nm) in both as-coated (AC) and post-HT (HT) states when the Sn-doped titanium oxide layer was sputter deposited in an atmosphere containing 70% oxygen ($O_2$) gas and 30% argon (Ar) gas (sccm).
Figure 6:
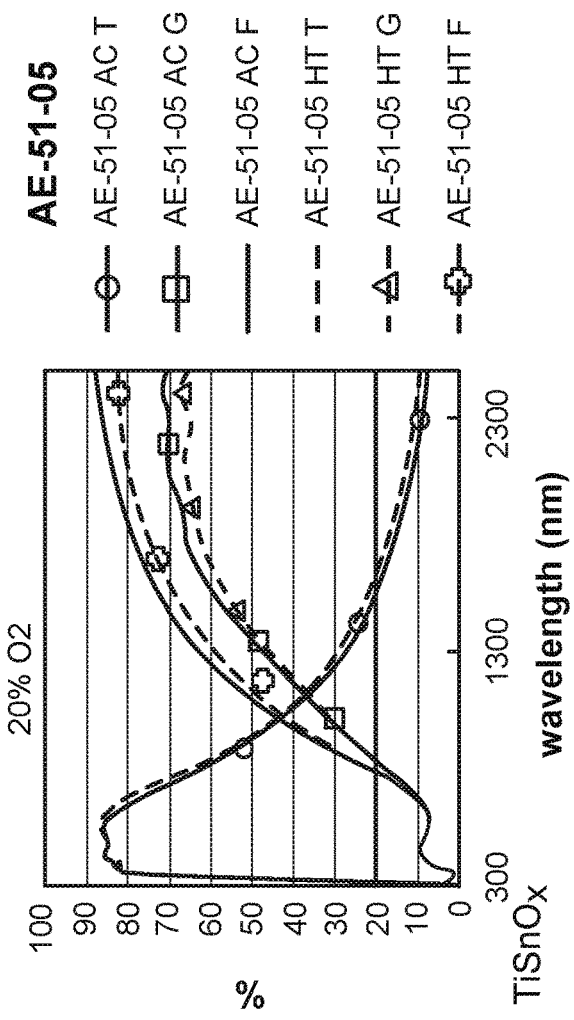
FIG. 6 is a percentage (%) versus wavelength (nm) graph plotting transmission (T) %, glass side reflection (G) %, and film side reflection (F) % of a layer stack including a high index Sn-doped titanium oxide layer versus wavelength (nm) in both as-coated (AC) and post-HT (HT) states when the Sn-doped titanium oxide layer was sputter deposited in an atmosphere containing 20% oxygen ($O_2$) gas and 80% argon (Ar) gas (sccm).

Example embodiments of this invention provide for a high index doped titanium oxide dielectric layer(s) designed to suppress crystallinity, irrespective of HT conditions such as thermal tempering. A high index doped titanium oxide dielectric layer 2 for use in low-E coatings is provided that has a high refractive index (n) and is amorphous or substantially amorphous and thus substantially stable upon heat treatment (HT). In example embodiments of this invention, a coated article includes a low emissivity (low-E) coating having at least one infrared (IR) reflecting layer 4 of a material such as silver, gold, or the like, and at least one high refractive index dielectric layer 2 (and possibly 6) of or including doped titanium oxide (e.g., $TiO_2$ doped with at least one additional element such as Sn, ZnSn, Y, Zr, and/or Ba). The doped titanium oxide layer(s) 2 (and possibly 6) is designed and deposited in a manner so as to be amorphous or substantially amorphous (as opposed to crystalline) in the low-E coating, so as to better withstand optional heat treatment (HT) such as thermal tempering. For example, comparing FIGS. 5 and 6, it has been found that sputter-depositing the doped titanium oxide layer(s) 2, 6 in an oxygen depleted atmosphere results in the doped titanium oxide layer 2, 6 being deposited in an amorphous or substantially amorphous (as opposed to crystalline) state, which in turn surprisingly and unexpectedly allows the layer and overall coating to be more stable upon HT. It has been found that the difference in atomic radii between Ti and its dopant(s) (e.g., between Ti and Sn, or Ti and Ba, or Ti and Y, etc.) can be enhanced and adjusted by changing the oxidation states of both atoms by reducing oxygen content in the sputtering gas atmosphere used when sputter-depositing the layer, and this oxygen depletion in the sputtering atmosphere causes a lattice disorder (e.g., disruption in the lattice formation) and impedes the formation of crystals in the deposited doped titanium oxide layer, thereby leading to amorphous or substantially amorphous structure for sputter deposited layer(s) 2, 6 which is stable even at high temperature thermal tempering. A large difference in ionic radii of Ti and dopant ions can disrupt the lattice and impede crystalline growth of the compound. The ionic radii depend on oxidation state and coordination number (e.g., see FIG. 7). Low oxygen conditions in the sputtering gaseous atmosphere force Ti into a lower oxidation state and/or lower coordination which in turn results in a larger difference in ionic radii with the dopant (e.g., Sn, SnZn, Ba, or Y). For example, FIG. 6 illustrates that when the oxygen gas content used when sputtering a Sn-doped titanium oxide layer is dropped to 20% (e.g., remainder argon gas) the coating is much more thermally stable than when the oxygen content was at 70% in FIG. 5. FIG. 7 shows that 6 coordination at 4+ oxidation states Ti and Sn have fairly close ionic radii of 61 and 69 pm (difference of 8 pm) which provides for significant crystalline growth under normal deposition oxidation conditions, but when the oxidation states change to +2 upon oxygen depletion Ti and Sn have very different ionic radii of 86 and 118 pm (difference of 32 pm) so as to impede crystalline growth. The oxygen depletion may also or instead cause Ti to move to the 4 coordination, which will also result in a large difference in ionic radii between Ti and Sn as shown in FIG. 7. As a result, the doped titanium oxide layer(s) 2, 6 sputter-deposited in an oxygen depleted atmosphere is deposited in an amorphous or substantially amorphous state due to the large difference in ionic radii and lattice disruption and thus has thermal stability upon optional HT such as thermal tempering or heat bending. It will be appreciated that doped titanium oxide layer 2 (and/or 6) may be substoichiometric in certain example embodiments of this invention, so as to be only partially oxided, due to the oxygen depletion used when depositing the layer 2 (and/or 6). The high index layer(s) 2, 6 may be a dielectric high index layer in preferred embodiments, which may be provided for antireflection purposes, transmission, and/or color adjustment purposes, in addition to having thermal stability. In certain example embodiments, the low-E coating may be used in applications such as monolithic or insulating glass (IG) window units, vehicle windows, or the like.

"Substantially amorphous" as used herein means majority amorphous, and more amorphous than crystalline. For instance, "substantially amorphous" includes at least 60% amorphous, at least 80% amorphous, at least 90% amorphous, and fully amorphous. The amorphous or substantially amorphous high index doped titanium oxide layer(s) 2, 6 may be a transparent dielectric high index layer, and may be oxided and/or nitrided, in preferred embodiments, and is provided for antireflection purposes and/or color adjustment purposes, in addition to having thermal stability. When the doped titanium oxide layer(s) 2, 6 is/are nitride, it is preferably that the nitrogen content be small such as from 0-10%, more preferably from 0-5% (atomic %).

Thus, doped titanium oxide layer 2 (and possibly 6) discussed herein may be sputter-deposited in an oxygen depleted atmosphere in order to realize and amorphous or substantially amorphous sputter deposited layer. In certain example embodiments of this invention, no more than 50% of the gaseous atmosphere in which the doped titanium oxide layer 2 (and possibly 6) is sputter deposited is made up of oxygen gas, more preferably no more than 40%, even more preferably no more than 35%, and most preferably no more than 25%. The remainder of the gas in the atmosphere may be an inert gas such as argon gas, or the like. For example, an example 20% oxygen atmosphere in the sputtering chamber(s) is made up of 20% oxygen gas and 80% argon gas. Small amounts of other gas may also be included, intentionally or unintentionally.

FIG. 1 is a cross sectional view of a coated article according to an example embodiment of this invention. The coated article includes glass substrate 1 (e.g., clear, green, bronze, or blue-green glass substrate from about 1.0 to 10.0 mm thick, more preferably from about 1.0 mm to 6.0 mm thick), and a multi-layer coating (or layer system) provided on the substrate 1 either directly or indirectly. As shown in FIG. 1, the example low-E coating may be of or include high index amorphous or substantially amorphous transparent dielectric layer 2 based on doped titanium oxide as discussed herein, zinc oxide and/or zinc stannate inclusive contact layer 3 (e.g., $ZnO_x$ where "x" may be about 1; or $ZnAlO_x$), IR (infrared) reflecting layer 4 including or of silver, gold, or the like, upper contact layer 5 of or including an oxide of Ni and/or Cr (e.g., $NiCrO_x$) or other suitable material, and a dielectric overcoat of or including dielectric layer 6 that may be a medium index layer such as zinc oxide or zinc stannate, or may be a high index layer such as the doped titanium oxide discussed herein, optional medium index layer 7 of or including zinc oxide, tin oxide, and/or zinc stannate or other suitable material, and dielectric layer 8 of or including silicon nitride and/or silicon oxynitride or other suitable material. The silicon nitride inclusive layers (e.g., layer 8) may further include Al, oxygen, or the like, and the zinc oxide based layers may also include tin and/or aluminum. Other layers and/or materials may also be provided in the coating in certain example embodiments of this invention, and it is also possible that certain layers may be removed or split in certain example instances. For example, a zirconium oxide layer or a $AlSiBO_x$ layer (not shown) could be provided directly over and contacting silicon nitride layer 8. As another example, a medium index layer such as silicon nitride could be provided between the glass substrate 1 and high index layer 2. As another example, two silver based IR reflecting layers, spaced apart by a dielectric layer stack including tin oxide for instance, may be provided and the overcoat and/or undercoat of FIG. 1 may be used therein. Moreover, one or more of the layers discussed above may be doped with other materials in certain example embodiments of this invention. This invention is not limited to the layer stack shown in FIG. 1, as the FIG. 1 stack is provided for purposes of example only in order to illustrate an example location(s) for a high index doped titanium oxide layer(s) 2 and/or 6 discussed herein.

In monolithic instances, the coated article includes only one substrate such as glass substrate 1 (see FIG. 1). However, monolithic coated articles herein may be used in devices such as IG window units for example. Typically, an IG window unit may include two or more spaced apart substrates with an air gap defined therebetween. Example IG window units are illustrated and described, for example, in U.S. Pat. Nos. 5,770,321, 5,800,933, 6,524,714, 6,541,084 and US 2003/0150711, the disclosures of which are all hereby incorporated herein by reference. For example, the coated glass substrate shown in FIG. 1 may be coupled to another glass substrate via spacer(s), sealant(s) or the like with a gap being defined therebetween in an IG window unit. In certain example instances, the coating may be provided on the side of the glass substrate 1 facing the gap, i.e., surface #2 or surface #3. In other example embodiments, the IG window unit may include additional glass sheets (e.g., the IG unit may include three spaced apart glass sheets instead of two).

High index transparent dielectric layer 2 (and layer 6 when of doped titanium oxide discussed herein) preferably has a refractive index (n, measured at 550 nm) of at least 2.12, more preferably of at least 2.20, more preferably of at least 2.25. These layers may optionally include a small amount of nitrogen such as no greater than 15%, more preferably no greater than 10%, and most preferably no greater than 5% nitrogen (atomic %). Titanium oxide (e.g., $TiO_2$) is sputter deposited so as to be crystalline under normal sputtering conditions which involve high oxygen gas content. However, crystalline titanium oxide layers in low-E coatings are problematic because they are unstable upon HT such as thermal tempering.

High index transparent dielectric layer 2 (and layer 6 when of doped titanium oxide discussed herein) is based on titanium oxide and preferably includes titanium oxide (e.g., $TiO_2$ or $TiO_x$ where x is from 1.5 to 2.0, possibly from 1.6 to 1.97) doped with one or more of Sn, ZnSn, Y, Zr, and/or Ba. In certain example embodiments of this invention, doped titanium oxide layer 2 and/or 6 has a metal content of from about 70-99.5% Ti, more preferably from about 80-99% Ti, still more preferably from about 87-99% Ti, and from about 0.5 to 30% dopant, more preferably from about 1-20% dopant, and most preferably from about 1-13% dopant (atomic %), where the dopant is of or includes one or more of Sn, ZnSn, Y, Zr, and/or Ba. It has been found that these dopant amounts suffice for providing sufficient lattice mismatch upon oxygen depletion discussed herein, and also are low enough to allow the layer to have sufficiently high refractive index (n).

Transparent dielectric lower contact layer 3 may be of or include zinc oxide (e.g., ZnO), zinc stannate, or other suitable material. The zinc oxide of layer 3 may contain other materials as well such as Al (e.g., to form $ZnAlO_x$) or Sn in certain example embodiments. For example, in certain example embodiments of this invention, zinc oxide layer 3 may be doped with from about 1 to 10% Al (or B), more preferably from about 1 to 5% Al (or B), and most preferably about 2 to 4% Al (or B). The use of zinc oxide 3 under the silver in layer 4 allows for an excellent quality of silver to be achieved. Zinc oxide layer 3 is typically deposited in a crystalline state. In certain example embodiments (e.g., to be discussed below) the zinc oxide inclusive layer 3 may be formed via sputtering a ceramic ZnO or metal rotatable magnetron sputtering target.

Infrared (IR) reflecting layer 4 is preferably substantially or entirely metallic and/or conductive, and may comprise or consist essentially of silver (Ag), gold, or any other suitable IR reflecting material. The silver of IR reflecting layer 4 may be doped with other material(s), such as with Pd, Zn, or Cu, in certain example embodiments. IR reflecting layer 4 helps allow the coating to have low-E and/or good solar control characteristics such as low emittance, low sheet resistance, and so forth. The IR reflecting layer may, however, be slightly oxidized in certain embodiments of this invention. Multiple silver based IR reflecting layers 4 may be provided, spaced apart in low-E coating by at least one dielectric layer, in double or triple silver stacks including doped titanium oxide layers discussed herein in certain example embodiments of this invention.

Upper contact layer 5 is located over and directly contacting the IR reflecting layer 4, and may be of or include an oxide of Ni and/or Cr in certain example embodiments. In certain example embodiments, upper contact layer 5 may be of or include nickel (Ni) oxide, chromium/chrome (Cr) oxide, or a nickel alloy oxide such as nickel chrome oxide ($NiCrO_x$), or other suitable material(s) such as $NiCrMoO_x$, NiCrMo, Ti, $NiTiNbO_x$, $TiO_x$, metallic NiCr, or the like. Contact layer 5 may or may not be oxidation graded in different embodiments of this invention. Oxidation grading means that the degree of oxidation in the layer changes through the thickness of the layer so that for example a contact layer may be graded so as to be less oxidized at the contact interface with the immediately adjacent IR reflecting layer 4 than at a portion of the contact layer further or more/most distant from the immediately adjacent IR reflecting layer. Contact layer 5 may or may not be continuous in different embodiments of this invention across the entire IR reflecting layer 4.

Other layer(s) below or above the illustrated FIG. 1 coating may also be provided. Thus, while the layer system or coating is "on" or "supported by" substrate 1 (directly or indirectly), other layer(s) may be provided therebetween. Thus, for example, the coating of FIG. 1 may be considered "on" and "supported by" the substrate 1 even if other layer(s) are provided between layer 2 and substrate 1. Moreover, certain layers of the illustrated coating may be removed in certain embodiments, while others may be added between the various layers or the various layer(s) may be split with other layer(s) added between the split sections in other embodiments of this invention without departing from the overall spirit of certain embodiments of this invention. For example and without limitation, silicon nitride layer 5 may be removed.

While various thicknesses may be used in different embodiments of this invention, example thicknesses and materials for the respective layers on the glass substrate 1 in the FIG. 1 embodiment may be as follows, from the glass substrate outwardly (e.g., the Al content in the zinc oxide layer and the silicon nitride layers may be from about 1-10%, more preferably from about 1-5% in certain example instances). Thickness are in units of angstroms (Å).

TABLE 1

(Example Materials/Thicknesses; FIG. 1 Embodiment)

| Layer | Preferred Range (Å) | More Preferred (Å) | Example (Å) |
|---|---|---|---|
| Doped $TiO_x$ (layer 2) | 40-500 Å | 150-350 Å | 270 Å |
| ZnO or $ZnAlO_x$ (layer 3) | 10-240 Å | 35-120 Å | 40 Å |
| Ag (layer 4) | 40-160 Å | 65-125 Å | 110 Å |
| Contact (layer 5) | 10-70 Å | 20-50 Å | 34 Å |
| ZnSnO/doped $TiO_x$ (layer 6) | 30-350 Å | 80-200 Å | 100 Å |
| ZnO or $ZnAlO_x$ (layer 7) | 10-240 Å | 35-120 Å | 40 Å |
| $Si_xN_y$ (layer 8) | 50-250 Å | 80-180 Å | 100 Å |

In certain example embodiments of this invention, coated articles herein (e.g., see FIG. 1) may have the following low-E (low emissivity), solar and/or optical characteristics set forth in Table 2 when measured monolithically.

TABLE 2

Low-E/Solar Characteristics (Monolithic)

| Characteristic | General | More Preferred | Most Preferred |
|---|---|---|---|
| $R_s$ (ohms/sq.): | <=11.0 | <=10 | <=9 |
| $E_n$: | <=0.2 | <=0.15 | <=0.10 |
| $T_{vis}$ (%): | >=50 | >=60 | >=70 |

While high index transparent dielectric doped titanium oxide layer 2 (and possibly 6) is shown and described in connection with the low-E coating of FIG. 1 above, this invention is not so limited. Doped titanium oxide high index transparent dielectric layers (e.g., layer 2) described herein may be used as a high index layer(s) in any suitable low-E coating either above or below an IR reflecting layer(s). One or more of such doped titanium oxide layers 2 may be provided in any suitable low-E coating. For example and without limitation, amorphous or substantially amorphous doped titanium oxide layer 2 as described above and/or herein may be used to replace any high index (e.g., $TiO_x$ or $TiO_2$) layer in any of the low-E coatings in any of U.S. Pat. Nos. 9,212,417, 9,297,197, 7,390,572, 7,153,579, 9,365,450, and 9,403,345, all of which are incorporated herein by reference.

Figure 11:
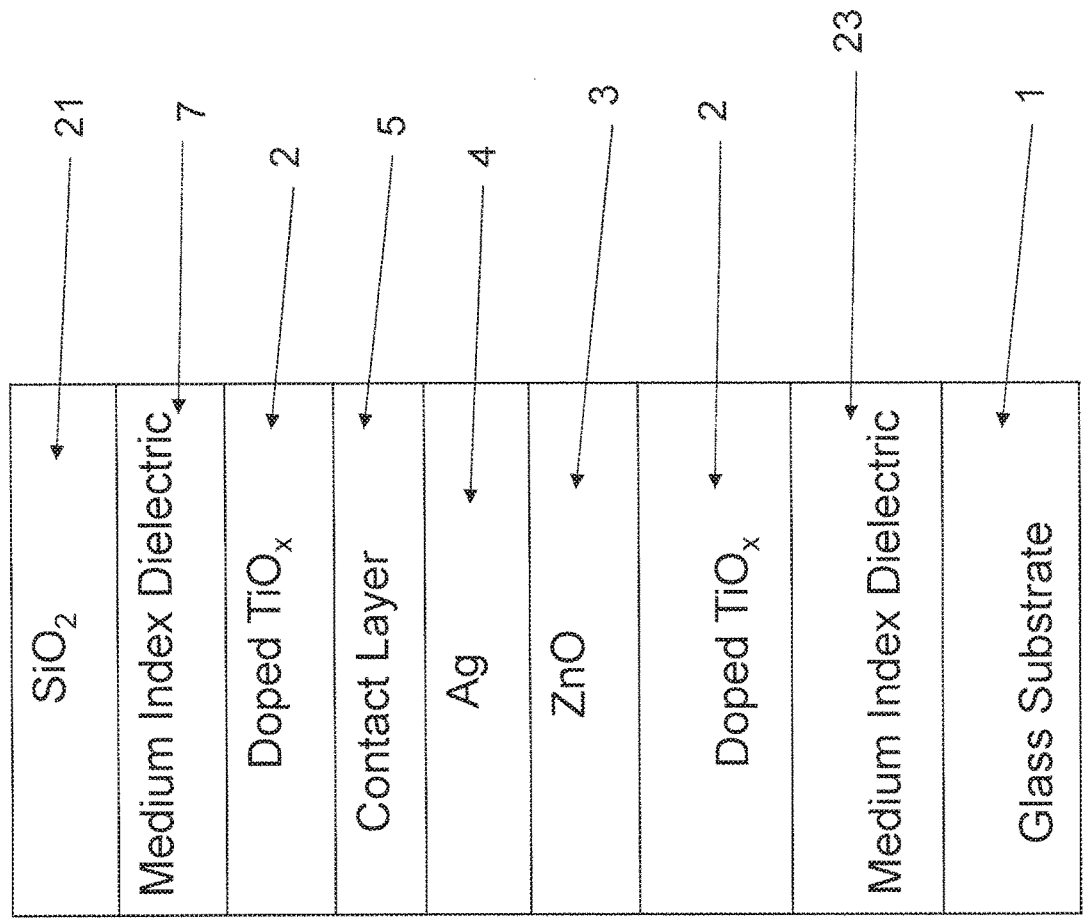
FIG. 11 is a cross sectional view of a coated article according to another example embodiment of this invention.

FIG. 11 is a cross sectional view of a coated article according to another example embodiment of this invention. FIG. 11 is similar to FIG. 1, except that in the FIG. 11 embodiment a medium index (n) layer 23 of or including material such as silicon nitride or zinc oxide is provided between and directly contacting the glass substrate 1 and the doped titanium oxide layer 2, and a low index layer 21 of a material such as Sift is provided in place of layer 8. It is noted that doped titanium oxide as discussed herein is used for the layer immediately above contact layer 5 in the FIG. 11 embodiment.

Examples according to certain example embodiments of this invention are as follows.

Example 1

Figure 4:
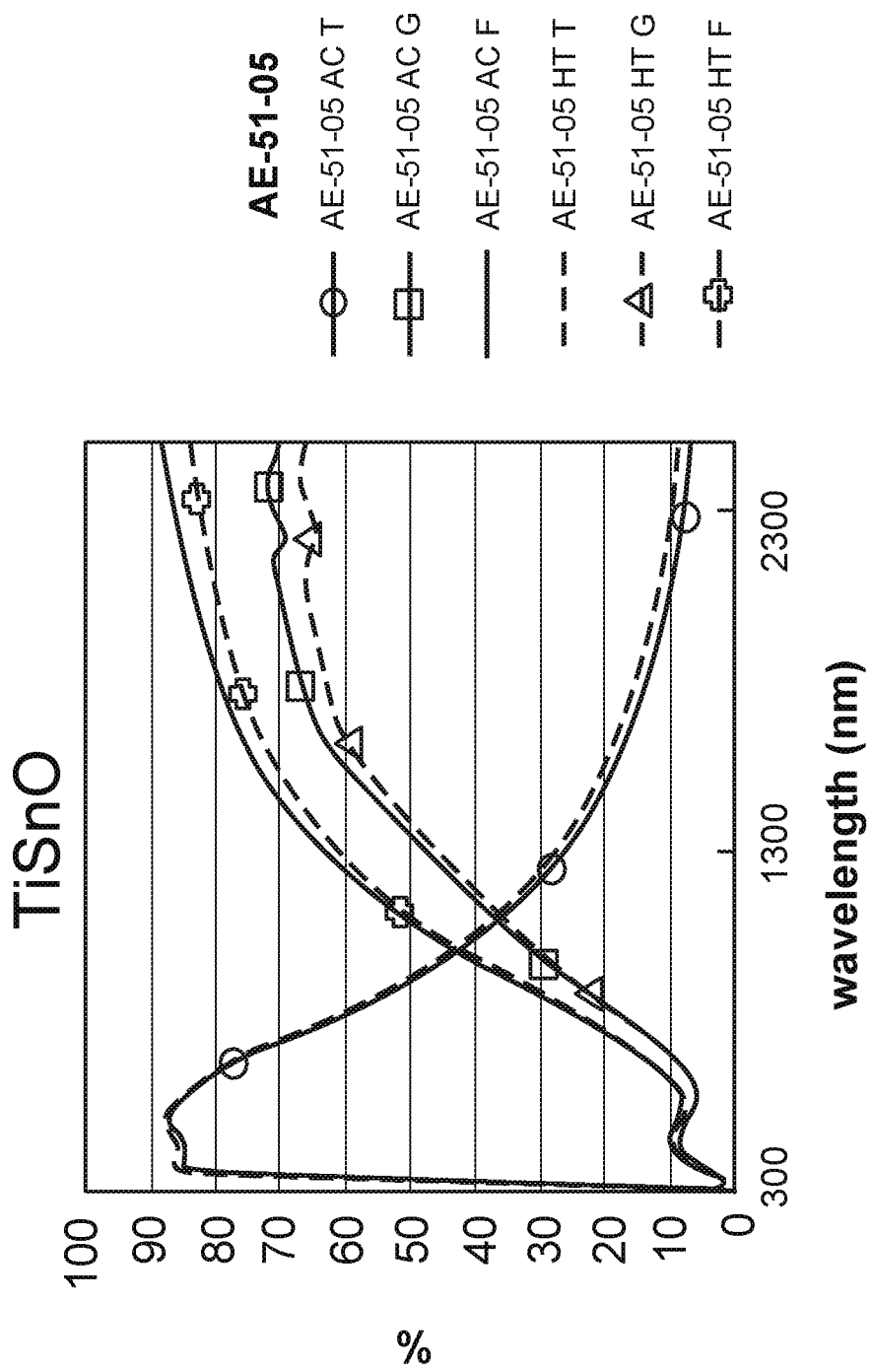
FIG. 4 is a percentage (%) versus wavelength (nm) graph plotting transmission (T) %, glass side reflection (G) %, and film side reflection (F) % of a layer stack including a high index Sn-doped titanium oxide layer versus wavelength (nm) in both as-coated (AC) and post-HT (HT) states.

Example 1 was a low-E coating on a glass substrate according to the FIG. 1 embodiment, for comparing to FIG. 2 above. The Example 1 layer stack was glass/$TiSnO_x$ (27 nm)/ZnO (4 nm)/Ag (11 nm)/$NiTiNbO_x$(2.4 nm)/ZnSnO (10 nm)/ZnO (4 nm)/SiN (10 nm), where the ZnO layers were doped with Al. Example 1 was the same coating stack as the Comparative Example (CE) described above regarding FIG. 2, except that in Example 1 the $TiO_2$ layer of the CE was replaced with Sn-doped titanium oxide ($TiSnO_x$). The high index layer 2 was titanium oxide doped with tin ($TiSnO_x$) in Example 1. The oxygen depleted atmosphere in which the $TiSnO_x$ layer 2 was sputter deposited contained 20% oxygen gas and 80% argon gas (4 sccm $O_2$ and 16 sccm Ar). Power applied to the Ti target was 500 W, and power applied to the Sn target was 50 W. Metal content of the $TiSnO_x$ layer 2 was 88% Ti and 12% Sn (atomic %). The coating of Example 1 had a normal emissivity ($E_n$) of 0.068. The $TiSnO_x$ layer 2 of Example 1 had a refractive index (n), at 550 nm, of 2.27. FIGS. 4 and 6 show the data of Example 1, before and after HT, and should be compared to the CE of FIG. 2. Note that FIGS. 4 and 6 are the same, but that FIG. 6 is downsized and provided next to FIG. 5 for purposes of comparison. In FIGS. 2, 4 and 6 at the right side where the curves are listed, the top three are "as coated" (AC) which means prior to the HT, and the bottom three are following the heat treatment and thus are labeled "HT." Thus, the AC curves are prior to HT, and the HT curves are after heat treatment at about 650 degrees C. for about eight minutes. The $TiSnO_x$ layer 2 was amorphous or substantially amorphous both as deposited as well as following the HT.

Comparing FIG. 4 (and FIG. 6) to the Comparative Example (CE) in FIG. 2, significant unexpected differences are demonstrated resulting from the doping of the titanium oxide layer 2 with tin. In FIG. 2, in the wavelength area from about 1500 to 2400 nm, there was a shift due to HT from the "AC T" (transmission, as coated prior to HT) curve to the "HT T" (transmission, after HT) curve of about 6%; there was a shift due to HT from the "AC G" (glass side reflectance, as coated prior to HT) curve to the "HT G" (glass side reflectance, after HT) curve of about 12-14%; and there was a shift due to HT from the "AC F" (film side reflectance, as coated prior to HT) curve to the "HT F" (film side reflectance, after HT) curve of about 12-13%. Overall, taken together in combination, there is a significant shift in transmission and reflection spectra upon HT which indicates a lack of thermal stability. The Comparative Example (CE) of FIG. 2 shows a significant shift in the IR range of the transmission and reflectance spectra, and increases in emissivity and haze were also found. In contrast, upon doping the titanium oxide layer with tin and depositing $TiSnO_x$ layer 2 in an oxygen depleted atmosphere, FIG. 4 shows that in the wavelength area from about 1500 to 2400 nm there was very little shift due to HT from the "AC T" (transmission, as coated prior to HT) curve to the "HT T" (transmission, after HT) curve of less than 4%; there was very little shift due to HT from the "AC G" (glass side reflectance, as coated prior to HT) curve to the "HT G" (glass side reflectance, after HT) curve of less than 5%; and there was very little shift due to HT from the "AC F" (film side reflectance, as coated prior to HT) curve to the "HT F" (film side reflectance, after HT) curve of less than 7 or 8%. These much smaller shifts due to HT result from the layer being in amorphous or substantially amorphous form due to the oxygen depleted atmosphere in which it was sputtered, and demonstrate thermal stability and heat treability of the coating. Accordingly, comparing FIG. 4 to FIG. 2, it can be seen that Example 1 was surprisingly and unexpectedly improved compared to the CE with respect to thermal stability and heat treatability (e.g., thermal tempering).

Example 2

Example 2 (FIG. 5) had the same layer stack as Example 1 (FIGS. 4 and 6) above, with the sole difference being that the $TiSnO_x$ layer 2 in Example 2 was sputter deposited in a gaseous atmosphere containing 70% oxygen gas whereas the $TiSnO_x$ layer 2 in Example 1 was sputter depositing in a gaseous atmosphere containing 20% oxygen gas. The high index layer 2 was titanium oxide doped with tin ($TiSnO_x$) in both of Examples 1-2. The oxygen depleted atmosphere in which the $TiSnO_x$ layer 2 was sputter deposited in Example 1 contained 20% oxygen gas and 80% argon gas (4 sccm $O_2$ and 16 sccm Ar), but in Example 2 the atmosphere was modified to contain 70% oxygen gas and 30% argon gas (14 sccm $O_2$ and 6 sccm Ar). Power applied to the Ti and Sn targets, the HT, and the metal content of the layer 2, were all the same in Examples 1 and 2. It can be seen by comparing FIG. 5 (Example 2 with 70% oxygen gas in sputtering atmosphere) to FIG. 6 (Example 1 with 20% oxygen gas in sputtering atmosphere), that the reduced oxygen gas in the sputtering atmosphere in FIG. 6 (Example 1) provided for significantly improved results over FIG. 5 (Example 2). FIG. 6 (like FIG. 4) shows that for Example 1 with 20% $O_2$ in the wavelength area from about 1500 to 2400 nm there was very little shift due to HT from the "AC T" (transmission, as coated prior to HT) curve to the "HT T" (transmission, after HT) curve of less than 4%; there was very little shift due to HT from the "AC G" (glass side reflectance, as coated prior to HT) curve to the "HT G" (glass side reflectance, after HT) curve of less than 5%; and there was very little shift due to HT from the "AC F" (film side reflectance, as coated prior to HT) curve to the "HT F" (film side reflectance, after HT) curve of less than 7 or 8%. However, FIG. 5 shows that for Example 2 with an increased 70% $O_2$ in the wavelength area from about 1500 to 2400 nm there was a higher shift due to HT from the "AC T" (transmission, as coated prior to HT) curve to the "HT T" (transmission, after HT) curve of at least 64%; there was a much higher shift due to HT from the "AC G" (glass side reflectance, as coated prior to HT) curve to the "HT G" (glass side reflectance, after HT) curve of at least 14%; and there was a much higher shift due to HT from the "AC F" (film side reflectance, as coated prior to HT) curve to the "HT F" (film side reflectance, after HT) curve of at least 16%. These much larger shifts in FIG. 5 for Example 2, compared to FIG. 6 for Example 1, due to HT result from the layer in Example 2 being much more crystalline due to the increased oxygen in the sputtering atmosphere in which the layer was sputtered, and demonstrate thermal instability for Example 2. Example 2 also had increased haze, compared to Example 1, both before and after the HT. Accordingly, comparing Example 1, Example, 2, and the Comparative Example of FIG. 2, it can be seen that the reduced oxygen gas in the sputtering atmosphere in Example 1 provides for unexpected and surprising results with respect to improved thermal stability, improved/reduced haze, and the ability to achieve an amorphous or substantially amorphous doped titanium oxide layer.

Example 3

Figure 9:
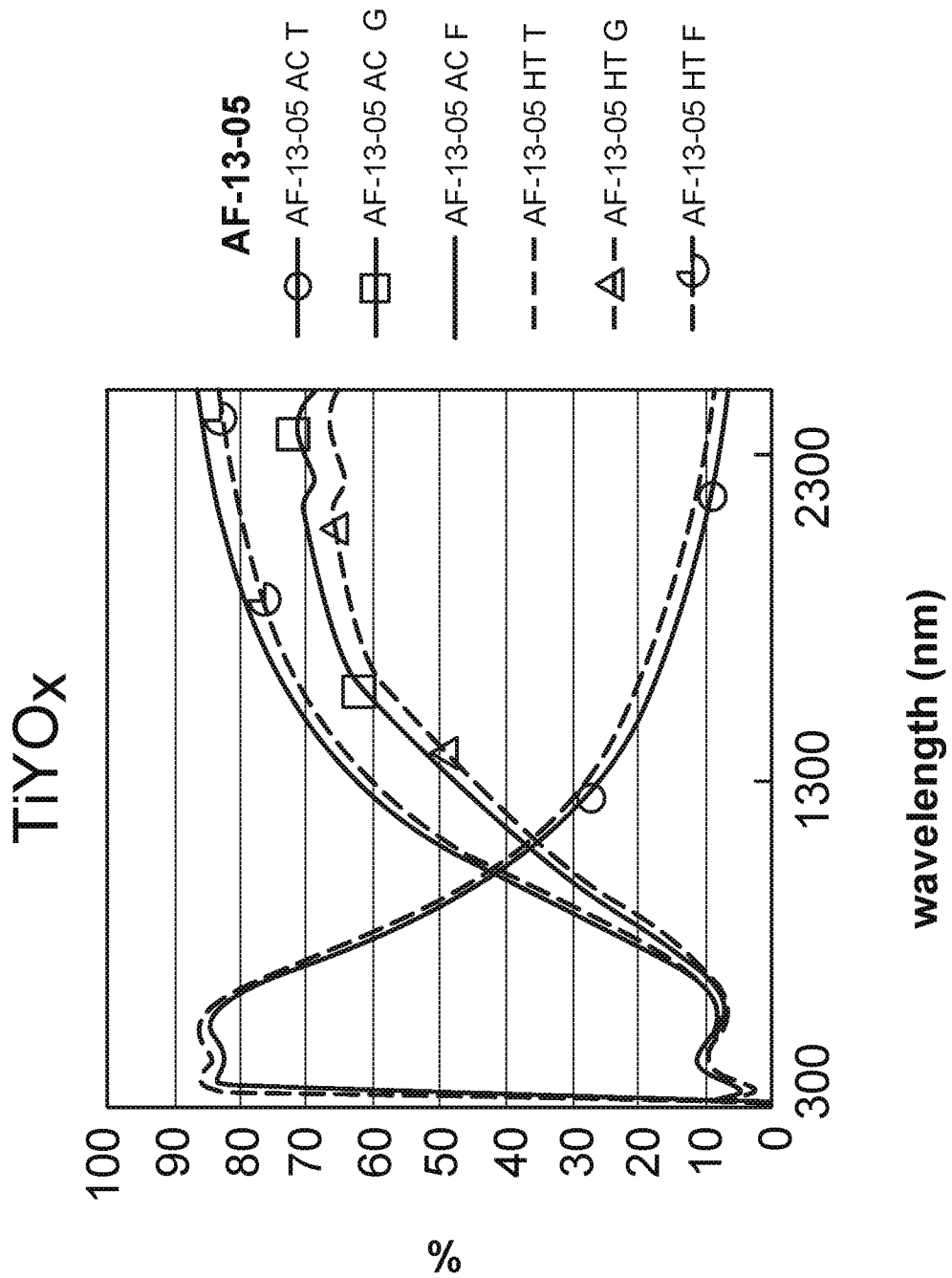
FIG. 9 is a percentage (%) versus wavelength (nm) graph plotting transmission (T) %, glass side reflection (G) %, and film side reflection (F) % of a layer stack including a high index Y-doped titanium oxide layer versus wavelength (nm) in both as-coated (AC) and post-HT (HT) states.

Example 3 was a low-E coating on a glass substrate according to the FIG. 1 embodiment, for comparing to FIG. 2 above. The Example 3 layer stack was glass/$TiYO_x$(27 nm)/ZnO (4 nm)/Ag (11 nm)/NiTiNbO$_x$(2.4 nm)/ZnSnO (10 nm)/ZnO (4 nm)/SiN (10 nm), where the ZnO layers were doped with Al. Example 3 was the same coating stack as Example 1 and the Comparative Example (CE) described above regarding FIG. 2, except that in Example 3 the high index layer 2 was Y-doped titanium oxide ($TiYO_x$). The high index layer 2 was titanium oxide doped with yttrium ($TiYO_x$) in Example 3, and sputter deposited in an oxygen depleted atmosphere. Metal content of the $TiYO_x$ layer was 95% Ti and 5% Sn (atomic %). The composition ratio of the $TiYO_x$ was Y:Ti:O corresponding to 5:95:245 (atomic). The $TiYO_x$ layer 2 of Example 3 had a refractive index (n), at 550 nm, of 2.42. FIG. 9 shows the data of Example 3, before and after HT, and should be compared to the CE of FIG. 2. In FIGS. 2 and 9 at the right side where the curves are listed, the top three are "as coated" (AC) which means prior to the HT, and the bottom three are following the heat treatment and thus are labeled "HT." Thus, the AC curves are prior to HT, and the HT curves are after heat treatment at about 650 degrees C. for about eight minutes. The $TiYO_x$ layer 2 was amorphous or substantially amorphous both as deposited as well as following the HT.

Comparing FIG. 9 to the Comparative Example (CE) in FIG. 2, significant unexpected differences are demonstrated resulting from the doping of the titanium oxide layer 2 with yttrium (Y). In FIG. 2, in the wavelength area from about 1500 to 2400 nm, there was a shift due to HT from the "AC T" (transmission, as coated prior to HT) curve to the "HT T" (transmission, after HT) curve of about 6%; there was a shift due to HT from the "AC G" (glass side reflectance, as coated prior to HT) curve to the "HT G" (glass side reflectance, after HT) curve of about 12-14%; and there was a shift due to HT from the "AC F" (film side reflectance, as coated prior to HT) curve to the "HT F" (film side reflectance, after HT) curve of about 12-13%. Overall, taken together in combination, there is a significant shift in transmission and reflection spectra upon HT which indicates a lack of thermal stability. The Comparative Example (CE) of FIG. 2 shows a significant shift in the IR range of the transmission and reflectance spectra, and increases in emissivity and haze were also found. In contrast, upon doping the titanium oxide layer with Y, FIG. 9 shows that in the wavelength area from about 1500 to 2400 nm there was very little shift due to HT from the "AC T" (transmission, as coated prior to HT) curve to the "HT T" (transmission, after HT) curve of less than 4%; there was very little shift due to HT from the "AC G" (glass side reflectance, as coated prior to HT) curve to the "HT G" (glass side reflectance, after HT) curve of less than 5 or 6%; and there was very little shift due to HT from the "AC F" (film side reflectance, as coated prior to HT) curve to the "HT F" (film side reflectance, after HT) curve of less than 6 or 7%. These much smaller shifts in Example 3 (compared to the CE) due to HT result from the Y-doped titanium oxide layer 2 of Example 3 being in amorphous or substantially amorphous form, and demonstrate thermal stability and heat treability of the coating. Accordingly, comparing FIG. 9 to FIG. 2, it can be seen that Example 3 was surprisingly and unexpectedly improved compared to the CE with respect to thermal stability and heat treatability (e.g., thermal tempering).

Example 4

Figure 8:
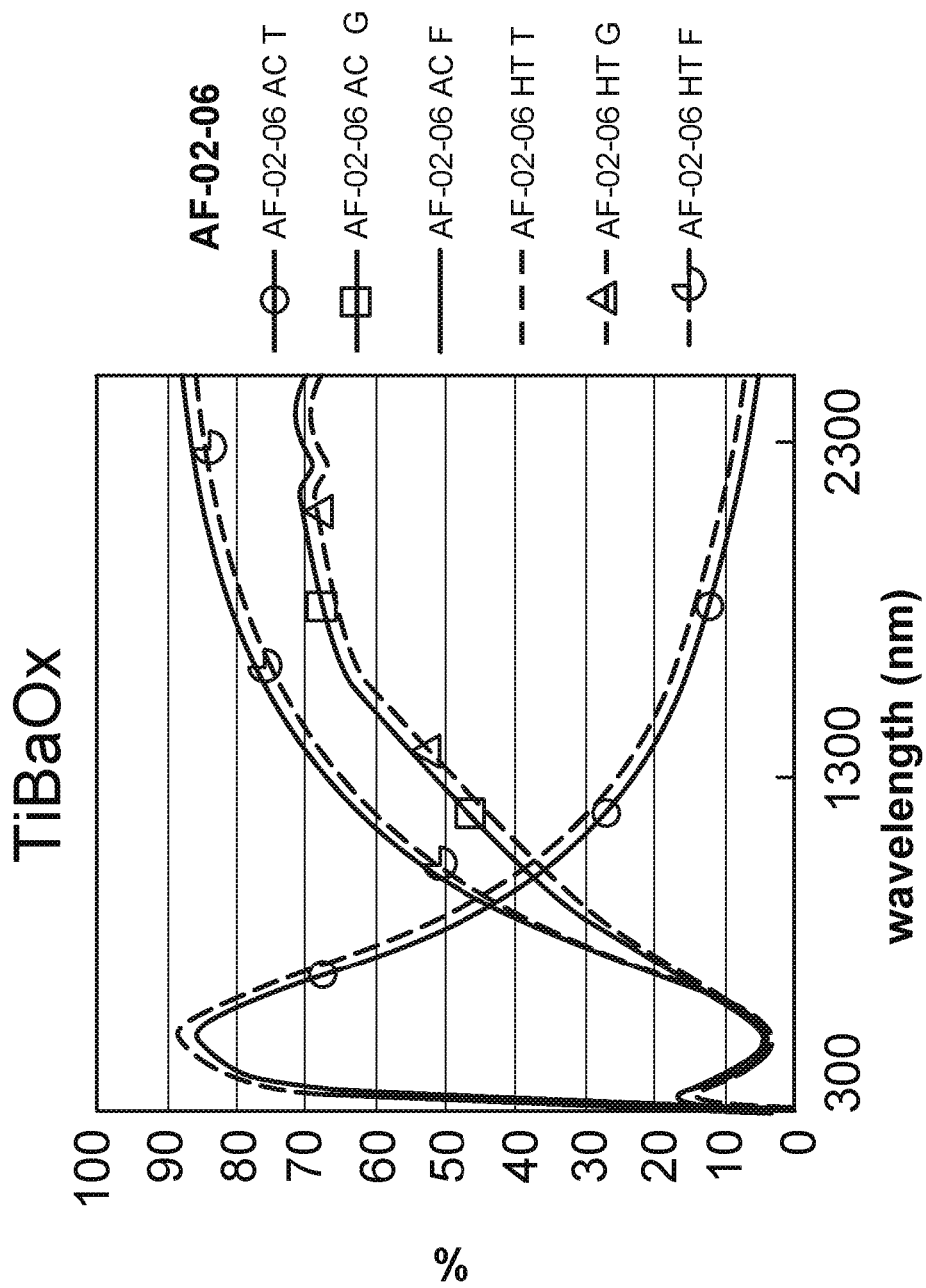
FIG. 8 is a percentage (%) versus wavelength (nm) graph plotting transmission (T) %, glass side reflection (G) %, and film side reflection (F) % of a layer stack including a high index Ba-doped titanium oxide layer versus wavelength (nm) in both as-coated (AC) and post-HT (HT) states.

Example 4 was a low-E coating on a glass substrate according to the FIG. 1 embodiment, for comparing to FIG. 2 above. The Example 4 layer stack was glass/$TiBaO_x$(27 nm)/ZnO (4 nm)/Ag (11 nm)/NiTiNbO$_x$(2.4 nm)/ZnSnO (10 nm)/ZnO (4 nm)/SiN (10 nm), where the ZnO layers were doped with Al. Example 4 was the same coating stack as Example 1 and the Comparative Example (CE) described above regarding FIG. 2, except that in Example 4 the high index layer 2 was titanium oxide barium ($TiBaO_x$). The high index layer 2 was titanium oxide supplemented with barium ($TiBaO_x$) in Example 4, and sputter deposited in an oxygen depleted atmosphere. The composition ratio of the $TiBaO_x$ was Ba:Ti:O corresponding to 0.98:1:3.36. FIG. 8 shows the data of Example 4, before and after HT, and should be compared to the CE of FIG. 2. In FIGS. 2 and 8 at the right side where the curves are listed, the top three are "as coated" (AC) which means prior to the HT, and the bottom three are following the heat treatment and thus are labeled "HT." Thus, the AC curves are prior to HT, and the HT curves are after heat treatment at about 650 degrees C. for about eight minutes. The $TiBaO_x$ layer 2 was amorphous or substantially amorphous both as deposited as well as following the HT.

Comparing FIG. 8 to the Comparative Example (CE) in FIG. 2, significant unexpected differences are demonstrated resulting from the providing of the barium in the titanium oxide layer 2. In FIG. 2, in the wavelength area from about 1500 to 2400 nm, there was a shift due to HT from the "AC T" (transmission, as coated prior to HT) curve to the "HT T" (transmission, after HT) curve of about 6%; there was a shift due to HT from the "AC G" (glass side reflectance, as coated prior to HT) curve to the "HT G" (glass side reflectance, after HT) curve of about 12-14%; and there was a shift due to HT from the "AC F" (film side reflectance, as coated prior to HT) curve to the "HT F" (film side reflectance, after HT) curve of about 12-13%. Overall, taken together in combination, there is a significant shift in transmission and reflection spectra upon HT which indicates a lack of thermal stability. The Comparative Example (CE) of FIG. 2 shows a significant shift in the IR range of the transmission and reflectance spectra, and increases in emissivity and haze were also found. In contrast, upon providing Ba in the titanium oxide layer, FIG. 8 shows that in the wavelength area from about 1500 to 2400 nm there was very little shift due to HT from the "AC T" (transmission, as coated prior to HT) curve to the "HT T" (transmission, after HT) curve of less than 3%; there was very little shift due to HT from the "AC G" (glass side reflectance, as coated prior to HT) curve to the "HT G" (glass side reflectance, after HT) curve of less than 4%; and there was very little shift due to HT from the "AC F" (film side reflectance, as coated prior to HT) curve to the "HT F" (film side reflectance, after HT) curve of less than 3%. These much smaller shifts in Example 4 (compared to the CE) due to HT result from the BaTi oxide layer 2 of Example 4 being in amorphous or substantially amorphous form, and demonstrate thermal stability and heat treability of the coating. Accordingly, comparing FIG. 8 to FIG. 2, it can be seen that Example 4 was surprisingly and unexpectedly improved compared to the CE with respect to thermal stability and heat treatability (e.g., thermal tempering).

It will be appreciated that while the Ba can be used as a dopant and added in small amounts to the titanium oxide layer, Ba can also have a larger percentage as in Example 4. Thus, in certain example embodiments of this invention, metal content of the TiBaO$_x$ layer may be from 30-70% Ti, more preferably from 40-60% Ti, and from 30-70% Ba, and more preferably from 40-60% Ba.

Example 5

Figure 10:
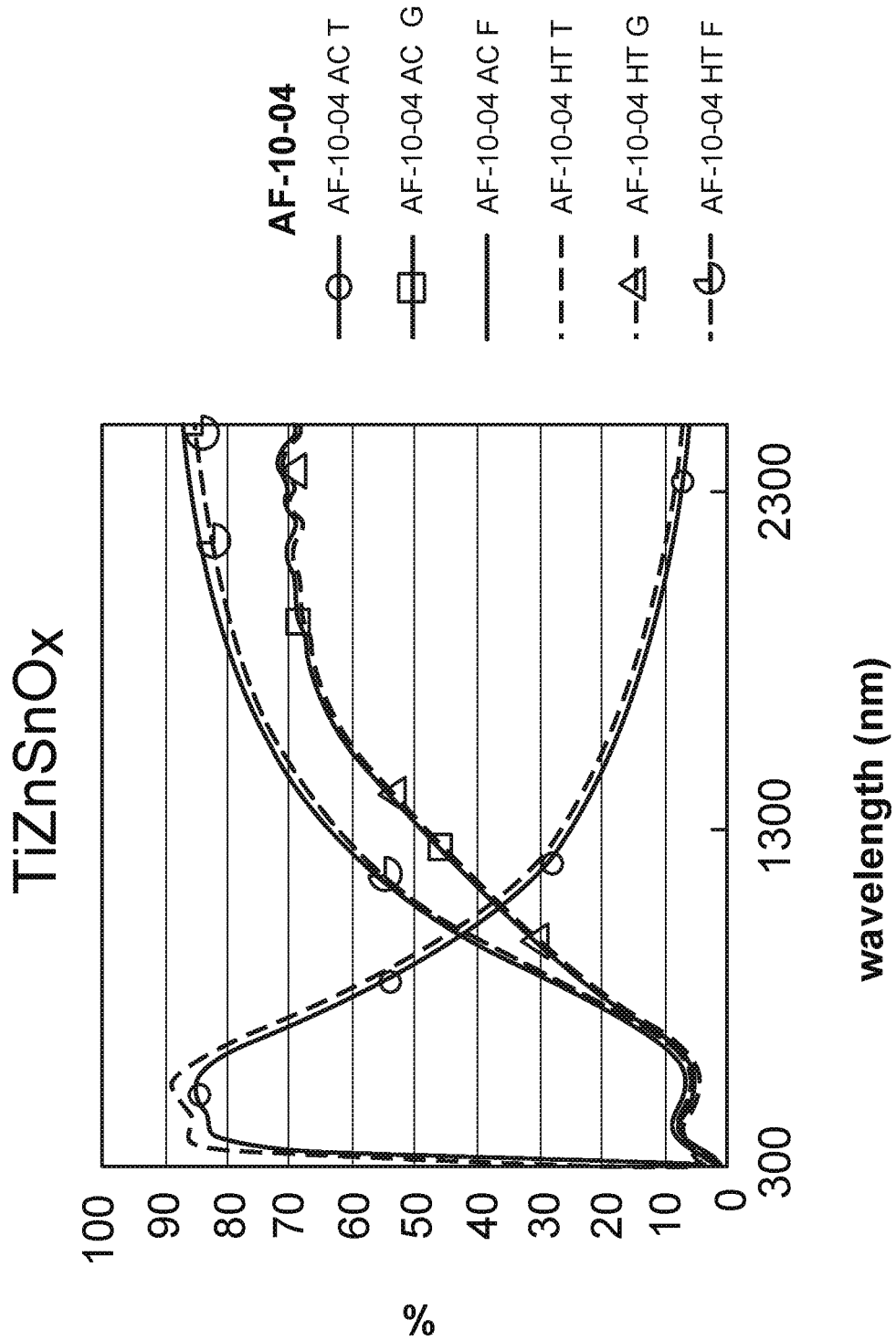
FIG. 10 is a percentage (%) versus wavelength (nm) graph plotting transmission (T) %, glass side reflection (G) %, and film side reflection (F) % of a layer stack including a high index SnZn-doped titanium oxide layer versus wavelength (nm) in both as-coated (AC) and post-HT (HT) states.

Example 5 was a low-E coating on a glass substrate according to the FIG. 1 embodiment, for comparing to FIG. 2 above. The Example 5 layer stack was glass/TiZnSnO$_x$(27 nm)/ZnO (4 nm)/Ag (11 nm)/NiTiNbO$_x$(2.4 nm)/ZnSnO (10 nm)/ZnO (4 nm)/SiN (10 nm) where the ZnO layers were doped with Al. Example 5 was the same coating stack as Example 1 and the Comparative Example (CE) described above regarding FIG. 2, except that in Example 5 the high index layer 2 was ZnSn-doped titanium oxide (TiZnSnO$_x$). The high index layer 2 was titanium oxide doped with ZnSn in Example 5, and sputter deposited in an oxygen depleted atmosphere containing 30% oxygen gas and the remainder argon gas. Sn and Zn content was approximately the same. The TiZnSnO$_x$ layer 2 of Example 5 had a refractive index (n), at 550 nm, of 2.17. FIG. 10 shows the data of Example 5, before and after HT, and should be compared to the CE of FIG. 2. In FIGS. 2 and 10 at the right side where the curves are listed, the top three are "as coated" (AC) which means prior to the HT, and the bottom three are following the heat treatment and thus are labeled "HT." Thus, the AC curves are prior to HT, and the HT curves are after heat treatment at about 650 degrees C. for about eight minutes. The TiZnSnO$_x$ layer 2 was amorphous or substantially amorphous both as deposited as well as following the HT.

Comparing FIG. 10 to the Comparative Example (CE) in FIG. 2, significant unexpected differences are demonstrated resulting from the doping of the titanium oxide layer 2 with Sn and Zn. In FIG. 2, in the wavelength area from about 1500 to 2400 nm, there was a shift due to HT from the "AC T" (transmission, as coated prior to HT) curve to the "HT T" (transmission, after HT) curve of about 6%; there was a shift due to HT from the "AC G" (glass side reflectance, as coated prior to HT) curve to the "HT G" (glass side reflectance, after HT) curve of about 12-14%; and there was a shift due to HT from the "AC F" (film side reflectance, as coated prior to HT) curve to the "HT F" (film side reflectance, after HT) curve of about 12-13%. Overall, taken together in combination, there is a significant shift in transmission and reflection spectra upon HT which indicates a lack of thermal stability. The Comparative Example (CE) of FIG. 2 shows a significant shift in the IR range of the transmission and reflectance spectra, and increases in emissivity and haze were also found. In contrast, upon doping the titanium oxide layer with Zn and Sn in Example 5, FIG. 10 shows that in the wavelength area from about 1500 to 2400 nm there was very little shift due to HT from the "AC T" (transmission, as coated prior to HT) curve to the "HT T" (transmission, after HT) curve of less than 3%; there was very little shift due to HT from the "AC G" (glass side reflectance, as coated prior to HT) curve to the "HT G" (glass side reflectance, after HT) curve of less than 2%; and there was very little shift due to HT from the "AC F" (film side reflectance, as coated prior to HT) curve to the "HT F" (film side reflectance, after HT) curve of less than 3%. These much smaller shifts in Example 5 (compared to the CE) due to HT result from the SnZn-doped titanium oxide layer 2 of Example 5 being in amorphous or substantially amorphous form, and demonstrate thermal stability and heat treability of the coating. Accordingly, comparing FIG. 10 to FIG. 2, it can be seen that Example 5 was surprisingly and unexpectedly improved compared to the CE with respect to thermal stability and heat treatability (e.g., thermal tempering).

Example 6

Figure 3:
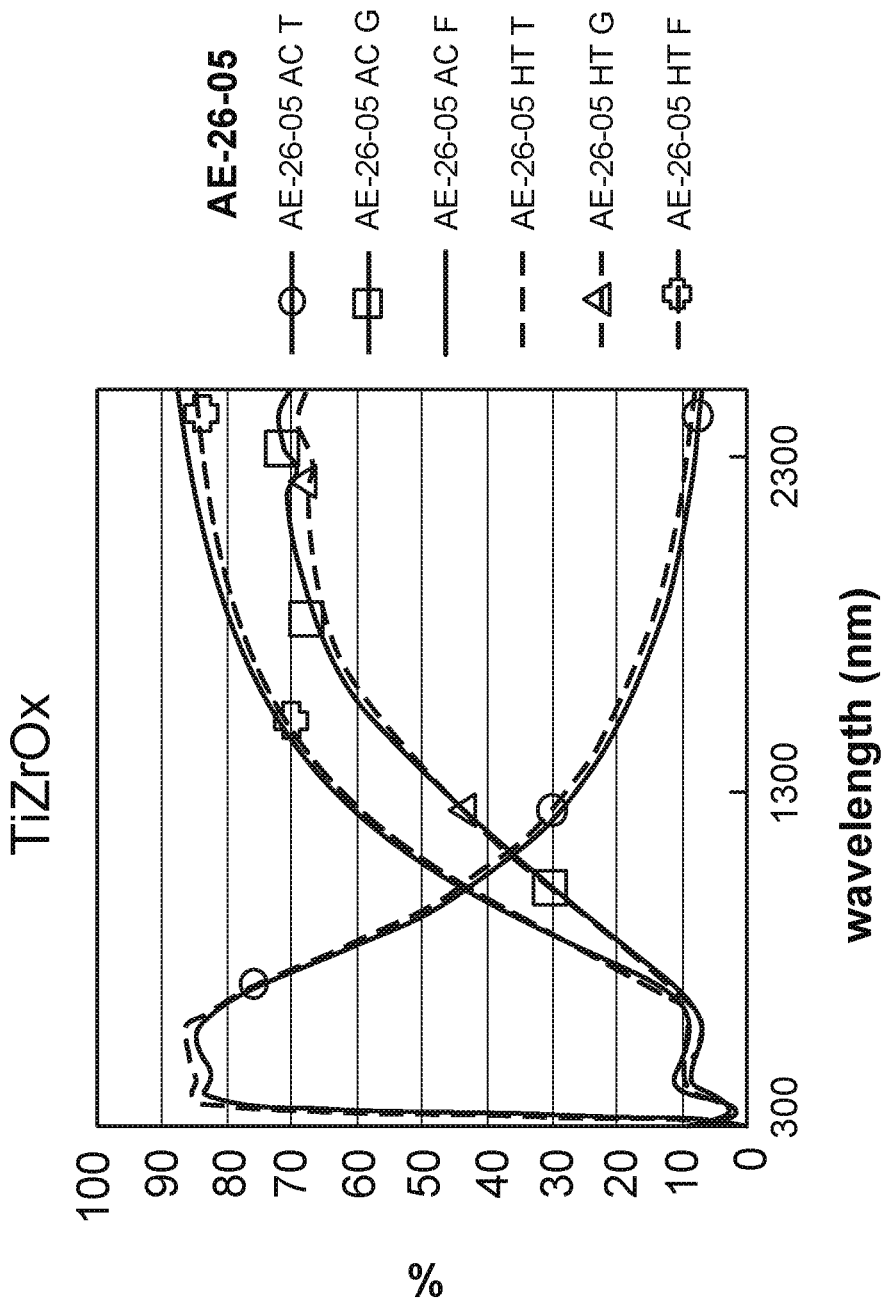
FIG. 3 is a percentage (%) versus wavelength (nm) graph plotting transmission (T) %, glass side reflection (G) %, and film side reflection (F) % of a layer stack including a high index Zr-doped titanium oxide layer versus wavelength (nm) in both as-coated (AC) and post-HT (HT) states.

Example 6 was a low-E coating on a glass substrate according to the FIG. 1 embodiment, for comparing to FIG. 2 above. The Example 6 layer stack was glass/TiZrO$_x$(27 nm)/ZnO (4 nm)/Ag (11 nm)/NiTiNbO$_x$(2.4 nm)/ZnSnO (10 nm)/ZnO (4 nm)/SiN (10 nm), where the ZnO layers were doped with Al. Example 6 was the same coating stack as Example 1 and the Comparative Example (CE) described above regarding FIG. 2, except that in Example 6 the high index layer 2 was Zr-doped titanium oxide (TiZrO$_x$). The high index layer 2 was titanium oxide doped with zirconium (TiZrO$_x$) in Example 6, and sputter deposited in an oxygen depleted atmosphere. FIG. 3 shows the data of Example 6, before and after HT, and should be compared to the CE of FIG. 2. In FIGS. 2 and 3 at the right side where the curves are listed, the top three are "as coated" (AC) which means prior to the HT, and the bottom three are following the heat treatment and thus are labeled "HT." Thus, the AC curves are prior to HT, and the HT curves are after heat treatment at about 650 degrees C. for about eight minutes. The TiZrO$_x$ layer 2 was amorphous or substantially amorphous both as deposited as well as following the HT.

Comparing FIG. 3 to the Comparative Example (CE) in FIG. 2, significant unexpected differences are demonstrated resulting from the doping of the titanium oxide layer 2 with Zr. In FIG. 2, in the wavelength area from about 1500 to 2400 nm, there was a shift due to HT from the "AC T"

(transmission, as coated prior to HT) curve to the "HT T" (transmission, after HT) curve of about 6%; there was a shift due to HT from the "AC G" (glass side reflectance, as coated prior to HT) curve to the "HT G" (glass side reflectance, after HT) curve of about 12-14%; and there was a shift due to HT from the "AC F" (film side reflectance, as coated prior to HT) curve to the "HT F" (film side reflectance, after HT) curve of about 12-13%. Overall, taken together in combination, there is a significant shift in transmission and reflection spectra upon HT which indicates a lack of thermal stability. The Comparative Example (CE) of FIG. 2 shows a significant shift in the IR range of the transmission and reflectance spectra, and increases in emissivity and haze were also found. In contrast, upon doping the titanium oxide layer with Zr in Example 6, FIG. 3 shows that in the wavelength area from about 1500 to 2400 nm there was very little shift due to HT from the "AC T" (transmission, as coated prior to HT) curve to the "HT T" (transmission, after HT) curve of less than 3%; there was very little shift due to HT from the "AC G" (glass side reflectance, as coated prior to HT) curve to the "HT G" (glass side reflectance, after HT) curve of less than 4%; and there was very little shift due to HT from the "AC F" (film side reflectance, as coated prior to HT) curve to the "HT F" (film side reflectance, after HT) curve of less than 4 or 5%. These much smaller shifts in Example 6 (compared to the CE) due to HT result from the Zr-doped titanium oxide layer 2 of Example 6 being in amorphous or substantially amorphous form, and demonstrate thermal stability and heat treability of the coating. Accordingly, comparing FIG. 3 to FIG. 2, it can be seen that Example 6 was surprisingly and unexpectedly improved compared to the CE with respect to thermal stability and heat treatability (e.g., thermal tempering).

In an example embodiment of this invention, there is provided a coated article including a coating supported by a glass substrate, the coating comprising: a first transparent dielectric layer on the glass substrate; an infrared (IR) reflecting layer comprising silver on the glass substrate, located over at least the first transparent dielectric layer; a second transparent dielectric layer on the glass substrate, located over at least the IR reflecting layer; and wherein at least one of the first and second transparent dielectric layers is amorphous or substantially amorphous, and comprises an oxide of Ti doped with at least one of Sn, SnZn, Zr, Y, and Ba, and wherein metal content of the amorphous or substantially amorphous layer comprises from about 70-99.5% Ti and from about 0.5-30% of at least one of Sn, SnZn, Zr, Y, and Ba (atomic %).

In the coated article of the immediately preceding paragraph, metal content of the amorphous or substantially amorphous layer may comprise from about 80-99% Ti and from about 1-20% of at least one of Sn, SnZn, Zr, Y, and Ba (atomic %).

In the coated article of any of the preceding two paragraphs, metal content of the amorphous or substantially amorphous layer may comprise from about 87-99% Ti and from about 1-13% of at least one of Sn, SnZn, Zr, Y, and Ba (atomic %).

In the coated article of any of the preceding three paragraphs, the amorphous or substantially amorphous layer may have a refractive index (n) of at least 2.12, more preferably of at least 2.20, and most preferably of at least 2.25 (at 550 nm).

In the coated article of any of the preceding four paragraphs, the coating may be a low-E coating and have a normal emissivity ($E_n$) of no greater than 0.2, more preferably no greater than 0.10.

In the coated article of any of the preceding five paragraphs, the amorphous or substantially amorphous layer may comprise one or more of: (i) an oxide of Ti and Sn, and a metal content of from about 70-99.5% Ti and from about 0.5-30% Sn (atomic %), which map optionally further comprise Zn; (ii) an oxide of Ti and Sn, and a metal content comprising from about 80-99% Ti and from about 1-20% Sn (atomic %); (iii) an oxide of Ti, Sn, and Zn; (iv) an oxide of Ti and Y, and a metal content comprising from about 70-99.5% Ti and from about 0.5-30% Y (atomic %), more preferably from about 80-99% Ti and from about 1-20% Y (atomic %); (v) an oxide of Ti and Ba, and a metal content comprising from about 70-99.5% Ti and from about 0.5-30% Ba (atomic %), more preferably from about 80-99% Ti and from about 1-20% Ba (atomic %); and/or (vi) an oxide of Ti and Zr, and a metal content comprising from about 70-99.5% Ti and from about 0.5-30% Zr (atomic %), more preferably from about 80-99% Ti and from about 1-20% Zr (atomic %).

In the coated article of any of the preceding six paragraphs, the first dielectric layer may be said amorphous or substantially amorphous layer and is located between the glass substrate and the IR reflecting layer, and may be in direct contact with the glass substrate.

In the coated article of any of the preceding seven paragraphs, the coating may comprise an overcoat including a layer comprising silicon nitride.

In the coated article of any of the preceding eight paragraphs, the coating may further comprise a layer comprising silicon nitride located between at least the glass substrate and the first transparent dielectric layer.

In the coated article of any of the preceding nine paragraphs, the coating may further comprise a layer comprising zinc oxide and/or zinc stannate located under and directly contacting the IR reflecting layer.

In the coated article of any of the preceding ten paragraphs, the coating may further comprise a layer comprising an oxide of Ni and/or Cr located over and directly contacting the IR reflecting layer.

In the coated article of any of the preceding eleven paragraphs, the coated article may be thermally tempered.

In the coated article of any of the preceding twelve paragraphs, the coated article may have a visible transmission of at least 50%, more preferably of at least 60%, and even more preferably of at least 70% (e.g., measured monolithically).

The coated article of any of the preceding thirteen paragraphs may be made by a method comprising sputter depositing the first transparent dielectric layer on the glass substrate; sputter-depositing the infrared (IR) reflecting layer (which may comprise silver, gold, or the like) on the glass substrate, located over at least the first transparent dielectric layer; sputter-depositing the second transparent dielectric layer on the glass substrate, located over at least the IR reflecting layer; and wherein at least one of the first and second transparent dielectric layers is sputter-deposited in a manner, via metal or ceramic target(s), so as to be amorphous or substantially amorphous, and comprise an oxide of Ti and at least one of Sn, SnZn, Zr, Y, and Ba. In the method, the at least one of the first and second transparent dielectric layers may be sputter-deposited, so as to be amorphous or substantially amorphous, in an oxygen depleted atmosphere so that a difference in ionic radii for metals during sputtering causes lattice disorder leading to amorphous or substantially amorphous structure of the layer. During sputter depositing the amorphous or substantially amorphous layer comprising an oxide of Ti and at least one of Sn, SnZn, Zr, Y, and Ba, oxygen during the sputter depositing may be controlled, via control oxygen gas in the sputtering atmosphere and/or oxygen in sputtering target material, so as to cause an average difference of at least 15 pm (more preferably of at least 20 pm) in ionic radii between Ti and at least one of Sn, SnZn, Zr, Y, and Ba and thus a lattice disorder leading to amorphous or substantially amorphous structure of the layer being sputter deposited. During sputter depositing the amorphous or substantially amorphous layer comprising an oxide of Ti and at least one of Sn, SnZn, Zr, Y, and Ba, the sputtering atmosphere may be controlled so as to contain no more than 50% oxygen gas, more preferably no more than 40% oxygen gas, and most preferably no more than 35% oxygen gas, and a remainder of the gas may be argon gas and/or any other suitable gas.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

The invention claimed is:

1. A coated article including a coating supported by a glass substrate, the coating comprising:

a first transparent dielectric layer on the glass substrate;

an infrared (IR) reflecting layer comprising silver on the glass substrate, located over at least the first transparent dielectric layer;

a second transparent dielectric layer on the glass substrate, located over at least the IR reflecting layer; and wherein at least one of the first and second transparent dielectric layers is amorphous or substantially amorphous, and comprises an oxide of Ti doped with at least one of Sn, SnZn, Zr, Y, and Ba, and wherein metal content of the amorphous or substantially amorphous layer comprises from about 70-99.5% Ti and from about 0.5-30% Zr (atomic %).

2. The coated article of claim 1, wherein metal content of the amorphous or substantially amorphous layer comprises from about 80-99% Ti and from about 1-20% Zr (atomic %).

3. The coated article of claim 1, wherein metal content of the amorphous or substantially amorphous layer comprises from about 87-99% Ti and from about 1-13% Zr (atomic %).

4. The coated article of claim 1, wherein the amorphous or substantially amorphous layer has a refractive index (n) of at least 2.12.

5. The coated article of claim 1, wherein the amorphous or substantially amorphous layer has a refractive index (n) of at least 2.20.

* * * * *